(12) United States Patent
Asakura et al.

(10) Patent No.: US 10,262,842 B2
(45) Date of Patent: Apr. 16, 2019

(54) ANALYSIS METHOD AND SEMICONDUCTOR ETCHING APPARATUS

(71) Applicant: Hitachi High-Technologies Corporation, Tokyo (JP)

(72) Inventors: Ryoji Asakura, Tokyo (JP); Kenji Tamaki, Tokyo (JP); Akira Kagoshima, Tokyo (JP); Daisuke Shiraishi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 975 days.

(21) Appl. No.: 14/303,636

(22) Filed: Jun. 13, 2014

(65) Prior Publication Data
US 2015/0083328 A1    Mar. 26, 2015

(30) Foreign Application Priority Data

Sep. 20, 2013    (JP) ................................ 2013-194812

(51) Int. Cl.
*H01J 37/32*        (2006.01)
*H01L 21/67*        (2006.01)
*H01L 21/311*      (2006.01)

(52) U.S. Cl.
CPC .... *H01J 37/3299* (2013.01); *H01J 37/32972* (2013.01); *B81C 2201/0132* (2013.01);
(Continued)

(58) Field of Classification Search
CPC ...... H01J 37/32972; H01J 37/32935–37/3299; H01J 37/32917; H01J 37/32926;
(Continued)

(56) References Cited

U.S. PATENT DOCUMENTS 5,759,424 A * 6/1998 Imatake .............. H01J 37/3299
                                                              156/345.24
5,980,767 A * 11/1999 Koshimizu ......... B81C 1/00587
                                                              216/60
(Continued)

FOREIGN PATENT DOCUMENTS

EP            0692703 A1 * 1/1996 ................ G01J 3/12
JP           10116817 A * 5/1998 ......... H01L 21/3065
(Continued)

OTHER PUBLICATIONS

G. S. May et al. "Statistical Experimental Design in Plasma Etch Modeling." IEEE Trans. Semicond. Mfg., vol. 1, No. 2, May 1991. pp. 83-98.*
(Continued)

*Primary Examiner* — Jeffrie R Lund
*Assistant Examiner* — Stanislav Antolin
(74) *Attorney, Agent, or Firm* — Baker Botts L.L.P.

(57) ABSTRACT

There is provided a method of analyzing data obtained from an etching apparatus for micromachining a wafer using plasma. This method includes the following steps: acquiring the plasma light-emission data indicating light-emission intensities at a plurality of different wavelengths and times, the plasma light-emission data being measured under a plurality of different etching processing conditions, and being obtained at the time of the etching processing, evaluating the relationship between changes in the etching processing conditions and changes in the light-emission intensities at the plurality of different wavelengths and times with respect to the wavelengths and times of the plasma light-emission data, and identifying the wavelength and the time of the plasma light-emission data based on the evaluation result, the wavelength and the time being to be used for the adjustment of the etching processing condition.

8 Claims, 9 Drawing Sheets

(52) U.S. Cl.
CPC ... *H01J 37/32926* (2013.01); *H01J 2237/334* (2013.01); *H01L 21/31138* (2013.01); *H01L 21/67069* (2013.01)

(58) Field of Classification Search
CPC .. H01J 2237/334–2237/3342; H01J 37/32009; H01J 37/33244; H01L 21/3065–21/30655; H01L 21/31105–21/31116; H01L 21/31127–21/31138; H01L 21/205; H01L 21/302; H01L 21/32135–21/32139; H01L 21/67063–21/67069; H01L 21/67253; H01L 22/20; G01N 21/66–21/68; H05H 1/0012–1/0018; H05H 1/0037; G01J 3/443; G01J 2003/4435; G05B 19/41875; G05B 21/02; G05B 2219/32053; G05B 2219/32182; G05B 23/0221; Y02P 90/22
See application file for complete search history.

(56) References Cited

U.S. PATENT DOCUMENTS

| | | | |
|---|---|---|---|
| 6,330,526 B1 * | 12/2001 | Yasuda | H01L 22/20 257/E21.525 |
| 6,387,819 B1 * | 5/2002 | Yu | H01L 21/31138 216/41 |
| 8,486,290 B2 | 7/2013 | Morisawa et al. | |
| 9,069,345 B2 * | 6/2015 | McCready | G05B 13/048 |
| 9,324,588 B2 * | 4/2016 | Asakura | H01J 37/32972 |
| 9,443,704 B2 * | 9/2016 | Asakura | H01J 37/32972 |
| 9,464,936 B2 * | 10/2016 | Asakura | G01J 3/443 |
| 2002/0017132 A1 * | 2/2002 | McNie | G01C 19/56 73/504.02 |
| 2002/0055259 A1 * | 5/2002 | Balasubramhanya | G01N 21/274 438/689 |
| 2002/0072872 A1 * | 6/2002 | Chatterjee | G06F 17/5036 702/117 |
| 2003/0045009 A1 * | 3/2003 | Tanaka | G05B 13/048 438/8 |
| 2003/0052086 A1 * | 3/2003 | Mizumura | H01J 37/32935 216/63 |
| 2003/0148548 A1 * | 8/2003 | Cohen | B81C 1/00396 438/22 |
| 2004/0174530 A1 * | 9/2004 | Usui | H01J 37/32935 356/504 |
| 2005/0060103 A1 * | 3/2005 | Chamness | H01L 21/67253 702/30 |
| 2009/0112334 A1 * | 4/2009 | Grichnik | F02D 41/1405 700/29 |
| 2009/0211706 A1 * | 8/2009 | Uchida | H01J 37/32935 156/345.25 |
| 2009/0276077 A1 * | 11/2009 | Good | G06K 9/6247 700/110 |
| 2010/0191361 A1 * | 7/2010 | McCready | G05B 13/048 700/104 |
| 2011/0315661 A1 * | 12/2011 | Morisawa | G01N 21/68 216/60 |
| 2012/0191236 A1 * | 7/2012 | Ausschnitt | G03F 7/705 700/105 |
| 2013/0268238 A1 * | 10/2013 | McCready | G05B 23/024 702/179 |
| 2014/0214350 A1 * | 7/2014 | Valcore, Jr. | H01J 37/32174 702/64 |
| 2014/0214351 A1 * | 7/2014 | Valcore, Jr. | H01J 37/32183 702/65 |
| 2014/0262029 A1 * | 9/2014 | Asakura | G01J 3/443 156/345.24 |
| 2016/0020123 A1 * | 1/2016 | Asakura | H01J 37/32972 216/59 |
| 2016/0203957 A1 * | 7/2016 | Asakura | H01J 37/32972 156/345.24 |
| 2017/0032945 A1 * | 2/2017 | Valcore, Jr. | H01J 37/32174 |

FOREIGN PATENT DOCUMENTS

| | | | | | |
|---|---|---|---|---|---|
| JP | 2002260978 | A | * | 9/2002 | ........ G05B 19/41875 |
| JP | 2003068717 | A | * | 3/2003 | ........... H01L 21/302 |
| JP | 3732768 | B | | 10/2005 | |
| JP | 3732768 | B2 | * | 1/2006 | ........... H01L 21/205 |
| JP | 2007227969 | A | * | 9/2007 | ............. G05B 21/02 |
| JP | 4128339 | B2 | * | 7/2008 | ......... G05B 23/0221 |
| JP | 2009-064814 | A | | 3/2009 | |
| JP | 2009064814 | A | * | 3/2009 | ........ H01L 21/3065 |
| JP | 4547396 | B2 | * | 9/2010 | ............ H01L 21/02 |
| JP | 2011023629 | A | * | 2/2011 | ........ H01L 21/3065 |
| KR | 10-2011-0084302 | A | | 7/2011 | |
| KR | 20110084302 | A | * | 7/2011 | ........... H05H 1/0037 |
| KR | 101215367 | B1 | * | 12/2012 | ........ H01J 37/32972 |
| TW | 201037779 | A1 | | 10/2010 | |

OTHER PUBLICATIONS

D. S. Boning et al. "Statistical Methods for Semiconductor Manufacturing." Wiley Encyclopedia of Electrical and Electronics Engineering. 1999. pp. 463-479.*

J. V. Ringwood et al. "Estimation and Control in Semiconductor Etch: Practice and Possibilities." IEEE Trans. Semicond. Mfg., vol. 23, No. 1, Feb. 2010. pp. 87-98.*

Shane Lynn. "Virtual Metrology for Plasma Etch Processes." PhD Thesis. 2011. pp. 337. National University of Ireland, Maynooth. Available Jun. 3, 2017 online at: http://eprints.maynoothuniversity.ie/2657/1/Thesis_Final_ShaneLynn.pdf.*

A. A. Orlikovskii et al. "In situ Diagnostics of Plasma Processes in Microelectronics: The Current Status and Immediate Prospects. Part IV." Russian Microelectronics, vol. 30, No. 6. 2001. pp. 343-370.*

D. Zeng et al. "Estimation and Control in Semiconductor Etch: Practice and Possibilities." IEEE Trans. Semicond. Mfg., vol. 22, No. 4, Nov. 2009. pp. 419-431.*

"Chapter 13: Factorial and Fractional Factorial Experiments for Process Design and Improvement" in Douglas C. Montgomery. "Introduction to Statistical Quality Control, 6th Ed." John Wiley & Sons, Inc. 2009. pp. 549-601.*

"Chapter 14: Process Optimization with Designed Experiments" in Douglas C. Montgomery. "Introduction to Statistical Quality Control, 6th Ed." John Wiley & Sons, Inc. 2009. pp. 602-628.*

"Chapter 4: Inferences about Process Quality" in Douglas C. Montgomery. "Introduction to Statistical Quality Control, 6th Ed." John Wiley & Sons, Inc. 2009. pp. 602-628. (Year: 2009).*

"Chapter 11: Multivariate Process Monitoring and Control" in Douglas C. Montgomery. "Introduction to Statistical Quality Control, 6th Ed." John Wiley & Sons, Inc. 2009. pp. 494-526. (Year: 2009).*

"Chapter 12: Engineering Process Control and SPC" in Douglas C. Montgomery. "Introduction to Statistical Quality Control, 6th Ed."John Wiley & Sons, Inc. 2009. pp. 527-545. (Year: 2009)*

A. A. Orlikovskii et al. "In situ Diagnostics of Plasma Processes in Microelectronics: The Current Status and Immediate Prospects. Part I." Russian Microelectronics, vol. 30, No. 2. 2001. pp. 69-87. (Year: 2001).*

A. A. Orlikovskii et al. "In situ Diagnostics of Plasma Processes in Microelectronics: The Current Status and Immediate Prospects. Part II." Russian Microelectronics, vol. 30, No. 3. 2001. pp. 137-154. (Year: 2001).*

A. A. Orlikovskii et al. "In situ Diagnostics of Plasma Processes in Microelectronics: The Current Status and Immediate Prospects. Part III." Russian Microelectronics, vol. 30, No. 5. 2001. pp. 275-294. (Year: 2001).*

Office Action, dated Aug. 20, 2015, which issued during the prosecution of Korean Patent Application No. 10-2014-0038483, which corresponds to the present application (partial English translation attached).

Office Action, dated Jul. 30, 2015, which issued during the prosecution of Taiwanese Patent Application No. 103115217, which

(56) References Cited

OTHER PUBLICATIONS corresponds to the present application (partial English translation attached).

* cited by examiner

| 23b | WAFER ID | p1 | p2 | ... | p100 |
|---|---|---|---|---|---|
| 23c | ETCHING PROCESSING RESULT | 0.75 | 0.80 | ... | 0.71 |

| WAFER ID | e1 | e2 | ... | e10 |
|---|---|---|---|---|
| ETCHING PROCESSING CONDITION (I.E., GAS FLOW QUANTITY) | 20 | 10 | ... | 30 |
| ETCHING PROCESSING RESULT | 0.72 | 0.91 | ... | 0.63 |

FIG. 7

| WAFER ID | p1 | | | |
|---|---|---|---|---|
| | WAVELENGTH | | | |
| | 201 | 202 | ... | 800 |
| TIME | 1 | 103 | 103 | ... | 77 |
| | 2 | 107 | 108 | ... | 82 |
| | ... | ... | ... | ... | ... |
| | 100 | 140 | 142 | ... | 96 |

FIG. 8

| | CONDITIONS | | | EVALUATION RESULTS | | | |
|---|---|---|---|---|---|---|---|
| CONDITION ID | WAVE-LENGTH | TIME | ETCHING PROCESSING CONDITION | EVALUATION VALUE 1 | EVALUATION VALUE 2 | SUM-TOTAL VALUE | SUM-TOTAL VALUE MINIMUM |
| 1 | 201 | 1-10 | GAS FLOW QUANTITY | 2.4 | 2.7 | 5.1 | |
| 2 | 211 | 1-10 | GAS FLOW QUANTITY | 2.5 | 2.6 | 5.2 | |
| ... | ... | ... | ... | ... | ... | ... | ... |
| 10 | 251 | 70-90 | GAS FLOW QUANTITY | 1.1 | 0.9 | 2.0 | ○ |
| ... | ... | ... | ... | ... | ... | ... | ... |

FIG. 9

| | 27a | | | |
|---|---|---|---|---|
| 27b — LIGHT-EMISSION INTENSITY AVERAGE VALUE | 106 | 108 | ... | 75 |
| 27c — ETCHING PROCESSING RESULT | 0.75 | 0.80 | ... | 0.71 |

FIG. 10

| | 28a | | | |
|---|---|---|---|---|
| 28b — LIGHT-EMISSION INTENSITY AVERAGE VALUE | 105 | 81 | ... | 123 |
| 28c — ETCHING PROCESSING CONDITION (I.E., GAS FLOW QUANTITY) | 20 | 10 | ... | 30 |

FIG. 12

PLEASE INPUT CONDITIONS TO BE EVALUATED,
AND PRESS THE CALCULATION EXECUTION.

D101  D102      D103    D104

| CONDITIONS | | | |
|---|---|---|---|
| CONDITION ID | WAVE-LENGTH | TIME | ETCHING PROCESSING CONDITION |
| 1 | 201 | 1–10 | GAS FLOW QUANTITY |
| 2 | 211 | 1–10 | GAS FLOW QUANTITY |
| ... | ... | ... | ... |
| 10 | 251 | 70–90 | GAS FLOW QUANTITY |
| ... | ... | ... | ... |

D105

CALCULATION EXECUTION

ANALYSIS METHOD AND SEMICONDUCTOR ETCHING APPARATUS

INCORPORATION BY REFERENCE

The present application claims priority from Japanese application JP2013-194812 filed on Sep. 20, 2013, the content of which is hereby incorporated by reference into this application.

BACKGROUND OF THE INVENTION

The present invention relates to a method of analyzing data obtained from a semiconductor etching apparatus for micromachining a semiconductor wafer using plasma, and this semiconductor etching apparatus.

In order to acquire the microscopic shape of a semiconductor device formed on a wafer, the following etching processing is performed: Namely, a substance is brought into its ionized state (i.e., its plasma state). Moreover, the substances existing on the wafer are removed by the action (i.e., reaction on the wafer surface) performed by this plasma-state substance.

An ionization phenomenon based on plasma is accompanied by the resultant light-emission phenomenon. Accordingly, an optical emission spectroscopy unit (:OES) is mounted on a plasma-used etching processing apparatus so that the light emitted from the plasma can be monitored. The data measured and acquired using this optical emission spectroscopy unit, hereinafter, will be referred to as "OES data". Also, the following control technique is applied to this etching processing apparatus: Namely, in this control technique, the etching processing result is stabilized by measuring the OES data, and adjusting the etching processing condition in accordance with the measurement result of the OES data.

The OES data is configured from the values of the light-emission intensities at a plurality of wavelengths and times. The adjustment of the etching processing condition requires that a wavelength and a time be selected out of this OES data. Here, it has become a problem that a suitable combination of the wavelength and the time be selected from among these plurality of wavelengths and times. As the method for selecting the wavelength to be used for the control over the etching processing, there have been known methods disclosed in JP-B-3732768. Here, the methods disclosed in JP-B-3732768 are as follows: The method of predicting the etching processing result by selecting the wavelength of the plasma light-emission using the aperture ratio, and the method of adjusting the etching processing condition in accordance with the prediction result.

In the methods disclosed in JP-B-3732768, however, no consideration is given to the fact that a variation occurs in the OES data if the etching processing condition is adjusted. On account of this, depending on the wavelength and time selected, a variation occurs in the OES data if the etching processing condition is adjusted. As a result, it has become a problem that the etching processing condition cannot be adjusted suitably.

SUMMARY OF THE INVENTION

In view of this situation, an object of the present invention is as follows: Namely, a wavelength and a time, which allow implementation of the stabilization of the etching processing result, are selected by way of giving consideration to a variation occurring in the OES data at the adjustment time of the etching processing condition.

In order to accomplish the above-described object, an analysis method of the present invention is implemented as follows: An analysis method of identifying a wavelength and a time of plasma light-emission data, the wavelength and the time of the plasma light-emission data being to be used for the adjustment of an etching processing condition in a semiconductor etching processing for applying the etching processing to a semiconductor wafer using the plasma, the analysis method including an acquisition step of acquiring the plasma light-emission data indicating light-emission intensities at a plurality of different wavelengths and times, the plasma light-emission data being measured under a plurality of different etching processing conditions, and being obtained at the time of the etching processing, a first evaluation step of evaluating the relationship between changes in the etching processing conditions and changes in the light-emission intensities at the plurality of different wavelengths and times with respect to the wavelengths and times of the plasma light-emission data, and an identification step of identifying the wavelength and the time of the plasma light-emission data based on the result of the first evaluation step, the wavelength and the time of the plasma light-emission data being to be used for the adjustment of the etching processing condition.

The analysis method further includes a second evaluation step of evaluating the relationship between the light-emission intensities at the plurality of different wavelengths and times of the plasma light-emission data, and the etching processing result. Moreover, at the above-described identification step, the wavelength and the time of the plasma light-emission data are identified from the result of the first evaluation step and the result of the second evaluation step, the wavelength and the time of the plasma light-emission data being to be used for the adjustment of the etching processing condition.

Advantageous Effects

According to the present invention, it becomes possible to select a wavelength and a time which are to be used for the control over the etching processing. This selection is made possible by way of giving consideration to a variation in the OES data caused by the change in the etching processing condition. This feature allows implementation of the stabilization of the etching processing result.

Other objects, features and advantages of the invention will become apparent from the following description of the embodiments of the invention taken in conjunction with the accompanying drawings.

BRIEF DESCRIPTION OF THE DRAWINGS

FIG. 6 is a diagram for illustrating a table example of the experiment data according to an embodiment of the present invention;

FIG. 7 is a diagram for illustrating a table example of the OES data according to an embodiment of the present invention;

FIG. 8 is a diagram for illustrating a table example of the condition-result data according to an embodiment of the present invention;

FIG. 9 is a diagram for illustrating a table example of the calculation data for calculating an evaluation value 1 according to an embodiment of the present invention;

FIG. 10 is a diagram for illustrating a table example of the calculation data for calculating an evaluation value 2 according to an embodiment of the present invention;

FIG. 12 is a diagram for illustrating the display screen according to an embodiment of the present invention;

DESCRIPTION OF THE EMBODIMENTS

Figure 1:
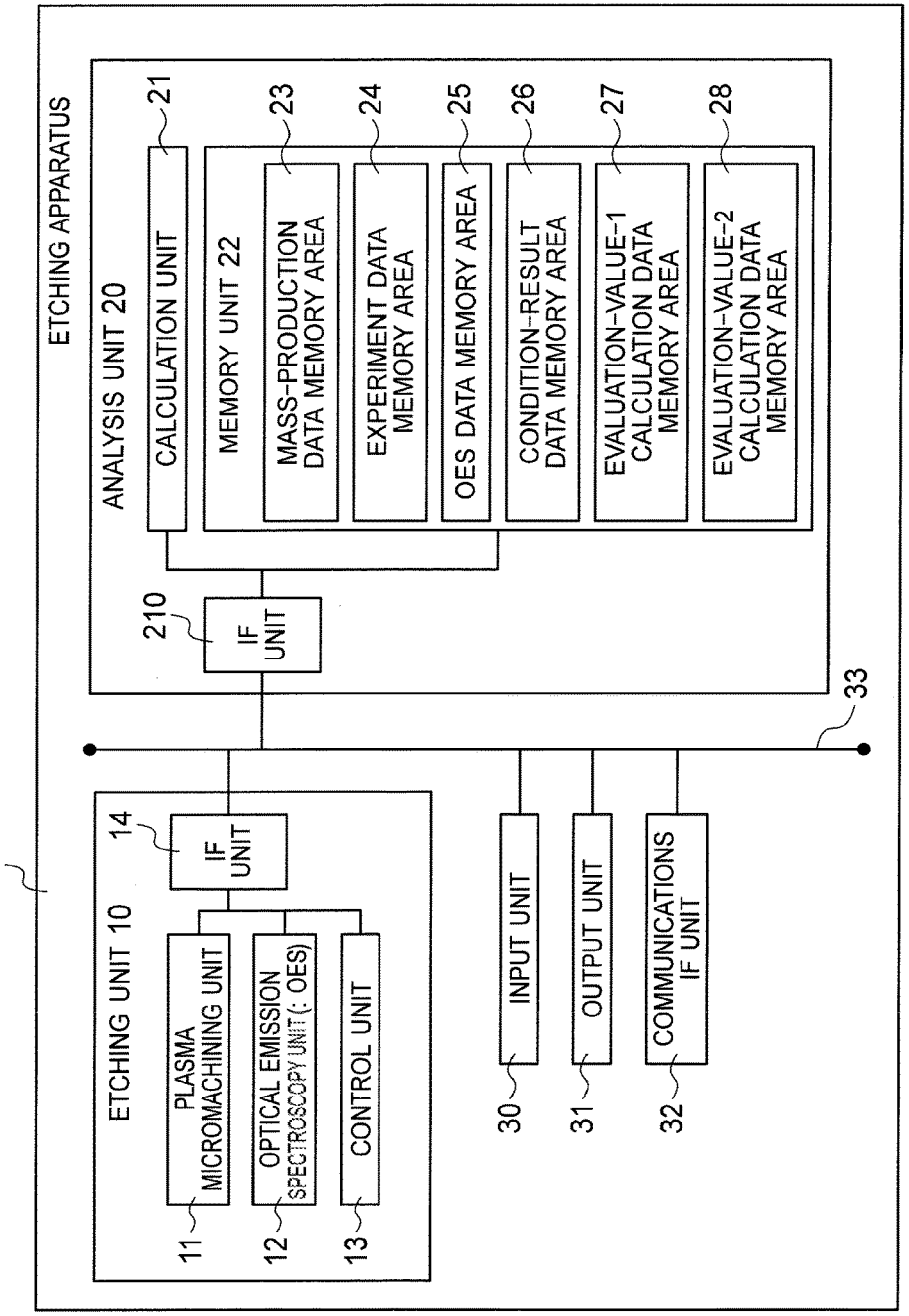
FIG. 1 is a configuration diagram for illustrating the configuration of an etching apparatus according to an embodiment of the present invention.

Hereinafter, based on the drawings, the explanation will be given below concerning embodiments of the present invention. Incidentally, in all the drawings for explaining the embodiments, the same reference numerals will be affixed to the same configuration components in principle. Accordingly, their repeated explanations will be omitted below.

[Etching Apparatus]

In the present invention, as illustrated in the configuration diagram of an etching apparatus in FIG. 1, the etching apparatus 1 includes an etching unit 10, an analysis unit 20, an input unit 30, an output unit 31, and a communications IF unit 32. These components are connected to each other via a bus 33.

The etching unit 10 includes a plasma micromachining unit 11, an optical emission spectroscopy unit (:OES) 12, a control unit 13, and an IF unit 14. The plasma micromachining unit 11 generates plasma, thereby micromachining a wafer. The optical emission spectroscopy unit (:OES) 12 acquires OES data, i.e., light-emission data from the plasma, while the etching processing is underway. The OES data is stored via the IF unit 14 into a memory unit 22 included in the analysis unit 20. The control unit 13 controls the processing performed by the plasma micromachining unit 11. The details of the etching unit 10 will be explained later in FIG. 2.

The analysis unit 20 performs an analysis processing in accordance with an analysis method of identifying a wavelength and a time which are to be used for the control over the etching processing. The analysis unit 20 includes a calculation unit 21, the memory unit 22, and an IF unit 29. The calculation unit 21 applies the analysis processing to data. The memory unit 22 memorizes mass-production data, experiment data, the OES data, and condition-result data.

Here, the mass-production data is data that is acquired when the etching processing is performed without making an adjustment of the etching processing condition. The experiment data is data that is acquired when the etching processing is performed after making a change in the etching processing condition. The OES data is the measurement data that is acquired by the optical emission spectroscopy unit (:OES) 12 while the etching processing is underway. The condition-result data is data that indicates the condition and result of the analysis processing performed by the calculation unit 21. Using the mass-production data and the OES data, the calculation unit 21 evaluates the relationship between the light-emission intensities and the etching processing result, in particular, a prediction error of the etching processing result. Also, using the experiment data and the OES data, the calculation unit 21 evaluates the relationship between the etching processing condition and the light-emission intensities, in particular, a prediction error of the light-emission intensities. Moreover, based on these two evaluations, the calculation unit 21 performs the processing of identifying the wavelength and the time which are to be used for the control over the etching processing. The details of the analysis processing performed by the calculation unit 21 will be explained later in FIG. 9.

The input unit 30 is a component such as, e.g., a mouse or keyboard for receiving an information input by the user operation. The output unit 31 is a component such as, e.g., a display or printer for outputting information to the user. The communications IF unit 32 is an interface for establishing the connection with other apparatuses (such as an inspection apparatus for measuring the etching processing result) or systems (such as an already-existing production-managing system) via the bus 33 or an external network, and performing information transmission/reception. The bus 33 connects the respective components (such as 10, 20, 30, 31, and 32) to each other. The IF unit (such as 14 or 29) of each component is an interface for performing the information transmission/reception via the bus 33. Incidentally, the following configuration is also allowable: Namely, the analysis unit 20 is made independent, and the independent analysis unit 20 is connected via the IF unit to the etching apparatus including the etching unit.

[Etching Unit]

Figure 2:
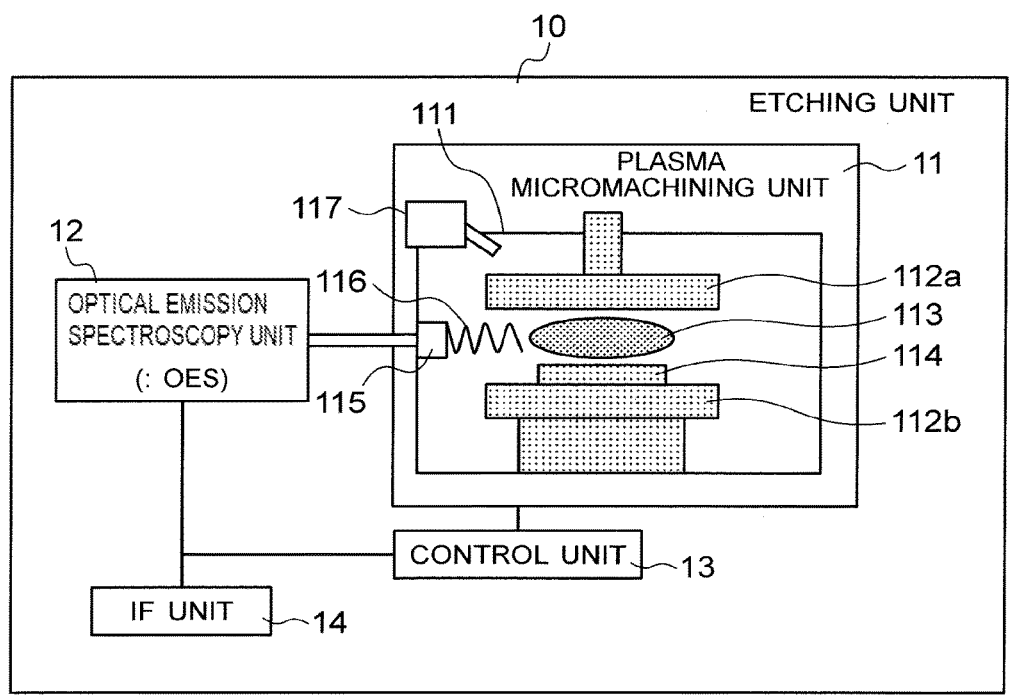
FIG. 2 is a configuration diagram for illustrating the configuration of an etching unit according to an embodiment of the present invention.

The etching unit 10 includes the plasma micromachining unit 11, the optical emission spectroscopy unit (:OES) 12, the control unit 13, and the IF unit 14. As illustrated in FIG. 2, the plasma micromachining unit 11 includes a chamber 111, electrodes 112a and 112b, a window 115, and a gas supplier 117. Based on an instruction issued from the control unit 13, the plasma micromachining unit 11 stores a wafer 114 into the inside of the chamber 111. Moreover, the unit 11 supplies an etching gas from the gas supplier 117, then applying a voltage thereto using the electrodes 112a and 112b. This operation gives rise to the generation of a gas 113 that is brought into its plasma state. Furthermore, the unit 11 causes this plasma-state gas 113 to collide with the wafer 114, thereby micromachining the wafer 114. This gas 113 contains elements contained within the etching gas supplied from the gas supplier 117, and elements produced from the wafer 114 in the process of this micromachining. Accordingly, this gas 113 gives rise to the generation of light 116 whose wavelengths correspond to these elements contained within this gas. This generated light 116 is measured by the optical emission spectroscopy unit (:OES) 12 through the window 115. In addition to issuing the instruction to the plasma micromachining unit 11, the control unit 13 performs the processing of adjusting the etching processing condition, using the OES data measured by the optical emission spectroscopy (:OES) 12 as its input data. This adjustment processing is explained in an etching-processing-condition adjustment processing, which will be described later.

After the termination of the etching processing, the processed wafer 114 is transported to another apparatus (such as the inspection apparatus). Also, a new different wafer 114 is stored into the etching unit 10, then being subjected to the etching processing. The data such as the dimension of shape of each processed wafer 114, which is obtained as a result of the etching processing, is measured by another apparatus (such as the inspection apparatus).

[OES Data]

Figure 3:
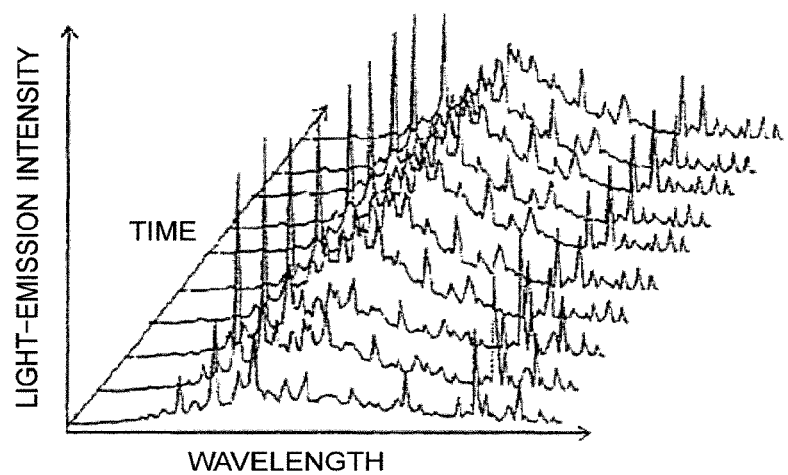
FIG. 3 is an explanatory diagram for explaining an example of the OES data.

FIG. 3 illustrates an example of the OES data measured by the optical emission spectroscopy unit (:OES) 12. The OES data is equipped with two-dimensional variables of the wavelength to be measured and the time from the etching start. The OES data indicates the value of the light-emission intensity measured at each wavelength and that of the light-emission intensity measured at each time. In accompaniment with the ID of a wafer for which this OES data is measured, the values of the light-emission intensities measured at each wavelength and at each time are stored into an OES data memory area 25, which will be described later.

[Etching-Processing-Condition Adjustment Processing]

Figures 4, 5:
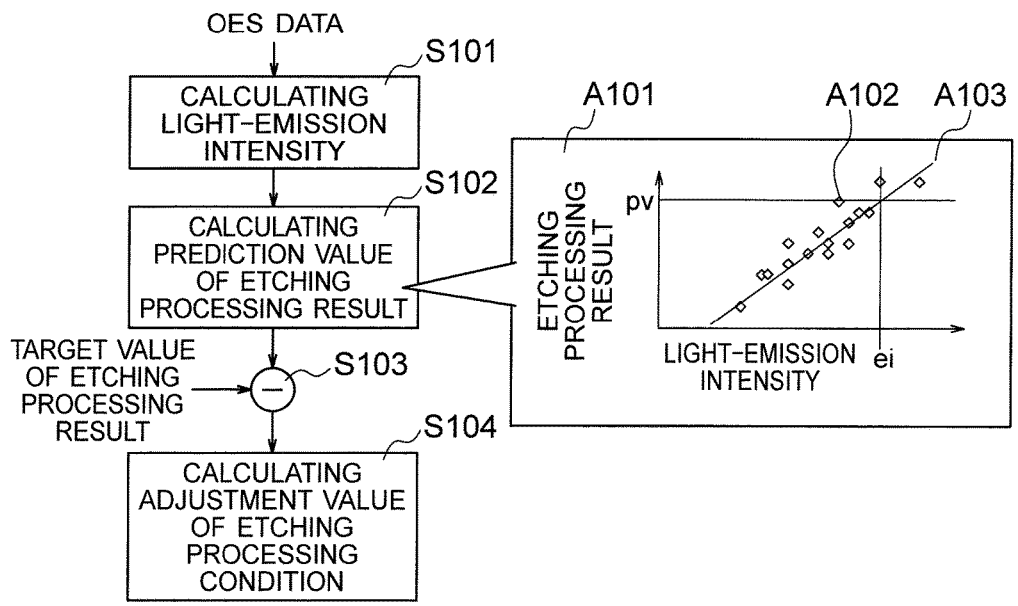
FIG. 4 is an explanatory diagram for explaining an example of the control of adjusting the etching processing condition.
FIG. 5 is a diagram for illustrating a table example of the mass-production data according to an embodiment of the present invention.

FIG. 4 illustrates an example of the etching-processing-condition adjustment processing performed by the control unit 13. The etching-processing-condition adjustment processing is a processing performed at the time of the etching processing. This adjustment processing can be performed for each wafer to which the etching processing is to be applied. Having received an instruction of adjusting the etching processing condition from the operator, the control unit 13 calculates the following values based on the OES data: Namely, the value of the light-emission intensity at a wavelength and a time which are determined in advance, or the average value of the light-emission intensities within sections of wavelengths and times which are determined in advance (S101).

Next, the control unit 13 performs the prediction of the etching processing result, using the light-emission intensity as its input data (S102). A101 illustrates an example of the prediction processing of the etching processing result performed at S102. A102 denotes the etching processing result, and the value of the light-emission intensity at the wavelength and the time which are determined in advance, or the average value of the light-emission intensities within the sections of the wavelengths and the times which are determined in advance. An individual point indicates an individual piece of wafer one by one. A102 shows that there is a correlation between the light-emission intensity and the etching processing result. A103 denotes an approximate straight line that is created from A102. For example, this approximate straight line is drawn so that the square sum-total of the distances from the respective points to this approximate straight line becomes equal to its minimum value. In the prediction processing at S102, using the approximate straight line of A103, the prediction value (pv) of the etching processing result is calculated from the light-emission intensity (ei) as is indicated by the dotted lines in the drawing. Incidentally, hereinafter, "time" will refer to "a time" or "a section of times".

Moreover, the control unit 13 calculates a difference between a target value of the etching processing and the prediction value (pv) of the etching processing result (S103). Furthermore, in accordance with this difference calculated, the control unit 13 calculates the adjustment value of the etching processing condition, e.g., the flow quantity of the etching gas (i.e., gas flow quantity) supplied from the gas supplier 117 (S104). After the termination of the etching-processing-condition adjustment processing, the control unit 13 performs the etching processing under this etching processing condition adjusted.

[Analysis Unit]

As illustrated in FIG. 1, the analysis unit 20 includes the calculation unit 21, the memory unit 22, and the IF unit 210. The memory unit 22 includes a mass-production data memory area 23, an experiment data memory area 24, the OES data memory area 25, and a condition-result data memory area 26.

The mass-production data memory area 23 stores therein information for identifying the ID of each wafer when the etching processing is applied to each wafer without making an adjustment of the etching processing condition, and information for identifying the etching processing result.

FIG. 5 illustrates a mass-production data table 23*a*, i.e., an example of the mass-production data memory area 23. The present table 23*a* includes fields such as a wafer ID field 23*b*, an etching-processing-result field 23*c*, and the like.

The wafer ID field 23*b* stores therein the information for identifying each wafer 114. The value stored in the wafer ID field 23*b* is caused to correspond to the value stored in the wafer ID field 25*b* of an OES data table 25*a* (which will be described later). As a result, the OES data and the etching processing result, which are acquired when the etching processing is applied to each wafer, can be caused to correspond to each other. The etching-processing-result field 23*c* stores therein information which, of the information for identifying good-or-bad quality of the etching processing result, is represented by a numerical value. For example, the field 23*c* stores therein the following measurement result that is obtained as follows: Namely, after the etching processing, the surface shape of each wafer 114 identified by the wafer ID field 23*b* is measured, using the inspection apparatus or the like connected to the etching apparatus 1. The dimension information on the surface shape measured on each wafer basis is stored into the mass-production data table 23*a* via the communications IF unit 32. The dimension information is acceptable as long as it is close to a target value determined in a separate way. Also, in addition to the dimension information, the current value on each wafer may be measured and stored.

The experiment data memory area 24 stores therein information for identifying the ID of each wafer when the etching processing is applied to each wafer after making a change in the etching processing condition such as an experiment, information for identifying the etching processing condition, and information for identifying the etching processing result.

FIG. 6 illustrates an experiment data table 24*a*, i.e., an example of the experiment data memory area 24. The present table 24*a* includes fields such as a wafer ID field 24*b*, an etching-processing-condition (i.e., gas-flow-quantity) field 24*c*, an etching-processing-result field 24*d*, and the like.

The wafer ID field 24*b* stores therein the information for identifying each wafer 114. The value stored in the wafer ID field 24*b* is caused to correspond to the value stored in the wafer ID field 25*b* of the OES data table 25*a* (which will be described later). As a result, the OES data, the etching processing condition at the time when the etching processing is performed, and the etching processing result, which are acquired when the etching processing is applied to each wafer, can be caused to correspond to each other. The etching-processing-condition (i.e., gas-flow-quantity) field 24c stores therein information for identifying the etching processing condition at the time when the etching processing is performed. The etching processing condition stored into the field 24c is the etching processing condition that is changed in the experiment made by the designer. The etching processing condition changed and stored is mainly the value of the flow quantity of the etching gas (i.e., gas flow quantity) supplied from the gas supplier 117. The etching processing condition changed and stored, however, may also be an etching processing condition other than the gas flow quantity, e.g., a voltage value at the time when the plasma is generated.

The etching-processing-result field 24d stores therein the information which, of the information for identifying the good-or-bad quality of the etching processing result, is represented by a numerical value. For example, the field 24d stores therein the following measurement result that is obtained as follows: Namely, after the etching processing, the surface shape of each wafer 114 identified by the wafer ID field 24b is measured, using the inspection apparatus or the like connected to the etching apparatus 1. The dimension information on the surface shape measured on each wafer basis is stored into the experiment data memory area 24 via the communications IF unit 32.

FIG. 7 illustrates the OES data table 25a, i.e., an example of the OES data memory area 25. The present table 25a includes fields such as a wafer ID field 25b, a light-emission intensity field 25c, and the like. Incidentally, a plurality of tables 25a exist in the number of the wafers whose OES data has been measured.

The wafer ID field 25b stores therein the information for identifying each wafer 114. The value stored in the wafer ID field 25b is caused to correspond to the values stored in the wafer ID field 23b of the above-described mass-production data table 23a and the wafer ID field 24b of the above-described experiment data table 24a.

The light-emission intensity field 25c stores therein the value of the light-emission intensity measured at each wavelength and that of the light-emission intensity measured at each time.

FIG. 8 illustrates a condition-result data table 26a, i.e., an example of the condition-result data memory area 26. The present table 26a includes fields such as a condition ID field 26b, a wavelength field 26c, a time field 26d, an etching-processing-condition field 26e, an evaluation-value-1 field 26f, an evaluation-value-2 field 26g, a sum-total value field 26h, and a sum-total value minimum field 26i, and the like.

The condition ID field 26b stores therein information for identifying the correspondence relationship between the data stored into each row of the condition-result data table 26a, and data inputted on the screen illustrated in FIG. 10 (which will be described later). The wavelength field 26c stores therein information for identifying a candidate of the wavelength at which the light-emission intensity is calculated in the etching-processing-condition adjustment processing illustrated in FIG. 4. The time field 26d stores therein information for identifying a candidate of the time at which the light-emission intensity is calculated in the etching-processing-condition adjustment processing illustrated in FIG. 4. The etching-processing-condition field 26e stores therein information for identifying the etching processing condition that is adjusted in the etching-processing-condition adjustment processing illustrated in FIG. 4.

The evaluation-value-1 field 26f stores therein the following value: Namely, the etching processing condition stored into the etching-processing-condition field 26e is adjusted using the light-emission intensities obtained at the wavelength stored into the wavelength field 26c and the time stored into the time field 26d. Then, this value is obtained as a result of evaluating the good-or-bad quality of this adjustment from the relationship between the values of the light-emission intensities and the value of the etching processing result. The evaluation-value-2 field 26g stores therein the following value: Namely, the etching processing condition stored into the etching-processing-condition field 26e is adjusted using the light-emission intensities obtained at the wavelength stored into the wavelength field 26c and the time stored into the time field 26d. Then, this value is obtained as a result of evaluating the good-or-bad quality of this adjustment from the relationship between the value of the etching processing condition and the values of the light-emission intensities. The sum-total value field 26h stores therein the sum total of the value stored into the evaluation-value-1 field 26f and the value stored into the evaluation-value-2 field 26g. The sum-total value minimum field 26i stores "○" into its row in which the sum-total value stored into the sum-total value field 26h is the smallest sum-total value.

FIG. 9 illustrates an evaluation-value-1 calculation data table 27a, i.e., an example of the evaluation-value-1 calculation data memory area 27. The present table 27a includes fields such as a light-emission intensity average value field 27b, an etching-processing-result field 27c, and the like. The light-emission intensity average value field 27b stores therein a light-emission intensity average value that is obtained by averaging the values stored into the light-emission intensity fields 25c of the OES data table 25a. This storage of the light-emission intensity average value into the field 27b is performed in the analysis processing (which will be described later).

The etching-processing-result field 27c stores therein the value that is stored into the etching-processing-result field 23c of the mass-production data table 23a. This storage of the value into the field 27c is performed in the analysis processing (which will be described later). FIG. 10 illustrates an evaluation-value-2 calculation data table 28a, i.e., an example of the evaluation-value-2 calculation data memory area 28. The present table 28a includes fields such as a light-emission intensity average value field 28b, an etching-processing-condition (i.e., gas-flow-quantity) field 28c, and the like.

The light-emission intensity average value field 28b stores therein a light-emission intensity average value that is obtained by averaging the values stored into the light-emission intensity fields 25c of the OES data table 25a. This storage of the light-emission intensity average value into the field 28b is performed in the analysis processing (which will be described later).

The etching-processing-condition (i.e., gas-flow-quantity) field 28c stores therein the value that is stored into the etching-processing-condition (i.e., gas-flow-quantity) field 24c of the experiment data table 24a. This storage of the value into the field 28c is performed in the analysis processing (which will be described later).

[Analysis Processing by Analysis Unit 20]

Figure 11:
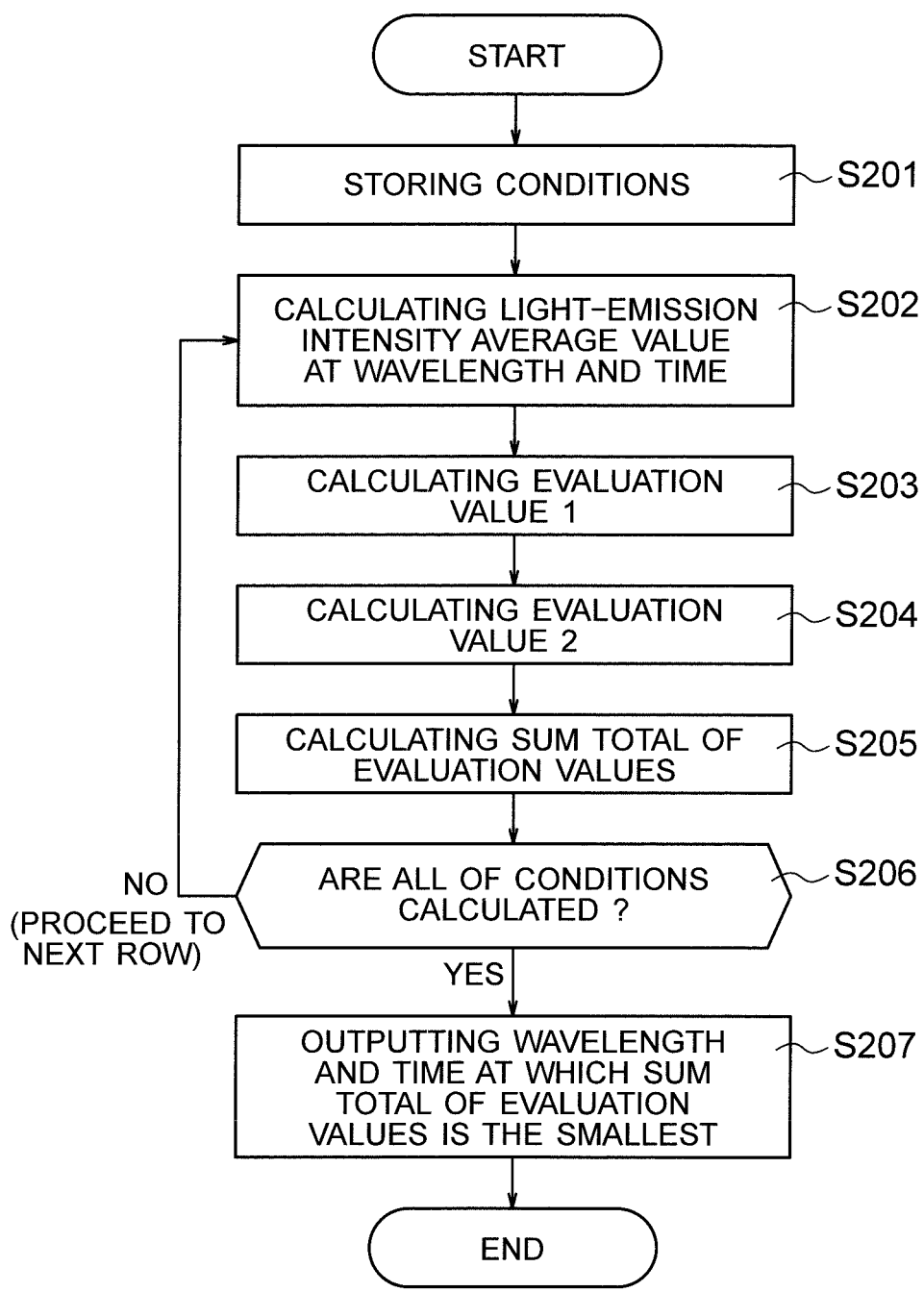
FIG. 11 is a diagram for illustrating an analysis processing flow by the analysis unit according to an embodiment of the present invention.

FIG. 11 illustrates the analysis processing that is mainly performed by the calculation unit 21 of the analysis unit 20. The processings such as S201 indicate the analysis processing performed by the analysis unit 20. The designer, who is going to introduce the etching-processing-condition adjustment processing into the etching apparatus 1, utilizes the present analysis processing in order to determine which wavelength and time should be used for the etching-processing-condition adjustment processing. On the display screen illustrated in FIG. 12, the designer inputs the wavelength, time, and etching processing condition to be evaluated, then giving an instruction of the calculation execution. Following this instruction, the analysis unit 20 executes the analysis processing, thereby outputting the wavelength and time suitable for the etching-processing-condition adjustment processing. This adjustment processing is a processing that is performed at a single time when a single process is introduced. Once the wavelength and time which should be used are determined, when performing the process corresponding thereto, it is all right just to carry out the processing illustrated in FIG. 4 using these wavelength and time determined.

A condition ID field D101 in FIG. 12 inputs therein information for identifying the wavelength, time, and etching processing condition to be used for the etching-processing-condition adjustment processing. If the value stored into the condition ID field D101 and the value stored into the condition ID field 26b of the condition-result data table 26a are equal to each other, it indicates that the respective rows are in a correspondence relationship with each other.

A wavelength field D102 inputs therein information for identifying a candidate of the wavelength to be used for the etching-processing-condition adjustment processing. A time field D103 inputs therein information for identifying a candidate of the time to be used for the etching-processing-condition adjustment processing. An etching-processing-condition field D104 inputs therein information for identifying a candidate of the etching processing condition to be used for the etching-processing-condition adjustment processing.

Incidentally, the wavelength inputted into the wavelength field D102 may be an automatically inputted wavelength determined in advance (e.g., wavelength determined with an equal interval set therebetween, such as 201, 211, or, . . . ). Also, the time inputted into the time field D103 may be an automatically inputted time determined in advance (e.g., time determined with an equal interval set therebetween, such as 1-10, 11-20, or, . . . ).

The designer presses a calculation execution D105, which executes the analysis processing to be performed by the analysis unit 20. Hereinafter, referring to FIG. 11, the explanation will be given below concerning the analysis processing.

(S201)

The calculation unit 21 stores the plural pieces of information, which are inputted into the condition ID field D101, the wavelength field D102, the time field D103, and the etching-processing-condition field D104, into the condition ID field 26b, the wavelength field 26c, the time field 26d, and the etching-processing-condition field 26e of the condition-result data table 26a, respectively.

With respect to the combination of the wavelength, time, and etching processing condition which are stored into each row of the condition-result data table, 26a, the calculation unit 21 executes the following processings from S202 to S205, starting sequentially from the uppermost row. At each of S202 to S205, the row that becomes the target of the processing will be referred to as "the concerned target row".

(S202)

The calculation unit 21 calculates an average value of the light-emission intensities. Namely, the calculation unit 21 acquires the wavelength candidate and the time candidate which are stored into the concerned target row of the condition-result data table 26a. Moreover, with respect to each column of the wafer ID field 23b of the mass-production data table 23a, the calculation unit 21 identifies an OES data table 25a that is specified by the value stored into the wafer ID field 23b. Furthermore, the calculation unit 21 calculates a light-emission intensity average value of the values that are stored into the light-emission intensity fields 25c which are specified by the wavelength candidate and the time candidate. For example, if the wavelength candidate is 201, and if the time candidate is 1-10, the calculation unit 21 calculates a light-emission intensity average value of the values that are stored into the light-emission intensity fields 25c whose wavelength is positioned in the 201 column, and whose time is positioned in the 1 to 10 rows. The light-emission intensity average value calculated and the value stored into the etching-processing-result field 23c are respectively stored into the light-emission intensity average value field 27b and the etching-processing-result field 27c of the evaluation-value-1 calculation data table 27a in such a manner that the correspondence relationship in the column is maintained.

Moreover, with respect to each column of the wafer ID field 24b of the experiment data table 24a, the calculation unit 21 identifies an OES data table 25a that is specified by the value stored into the wafer ID field 24b. Furthermore, the calculation unit 21 calculates a light-emission intensity average value of the values that are stored into the light-emission intensity fields 25c which are specified by the wavelength candidate and the time candidate. The light-emission intensity average value calculated and the value stored into the etching-processing-condition (i.e., gas-flow-quantity) field 24c are respectively stored into the light-emission intensity average value field 28b and the etching-processing-condition (i.e., gas-flow-quantity) field 28c of the evaluation-value-2 calculation data table 28a in such a manner that the correspondence relationship in the column is maintained.

(S203)

The calculation unit 21 calculates the value of the evaluation value 1, then storing this calculated value into the concerned target row of the evaluation-value-1 field 26f. Namely, the calculation unit 21 calculates the prediction error ($e_{11}$) that occurs when the etching processing result is predicted using the light-emission intensity, and the slope ($a_{11}$) of a function that allows the etching processing result to be predicted using the light-emission intensity. These calculations are performed using the values stored into the evaluation-value-1 calculation data table 27a, and the following Expressions (1) to (5):

[Expression 1]

$$X_{11} = \sum x_{1i}^2 - \frac{\left(\sum x_{1i}\right)^2}{n} \quad (1)$$

[Expression 2]

$$X_{12} = \sum y_{1i}^2 - \frac{\left(\sum y_{1i}\right)^2}{n} \quad (2)$$

[Expression 3]

$$X_{13} = \sum x_{1i} y_{1i} - \frac{\left(\sum x_{1i}\right)\left(\sum y_{1i}\right)}{n} \quad (3)$$

[Expression 4]

$$a_{11} = \frac{x_{13}}{x_{11}} \quad (4)$$

[Expression 5]

$$e_{11} = \frac{(x_{12} - a_{11}x_{13})}{n} \qquad (5)$$

In the present Expressions, the notation $x_{1i}$ denotes the value stored into the i-th column of the light-emission intensity average value field 27b of the evaluation-value-1 calculation data table 27a. The notation $y_{1i}$ denotes the value stored into the i-th column of the etching-processing-result field 27c thereof. The notation n denotes the column number of the evaluation-value-1 calculation data table 27a. The notation $\Sigma$ denotes the summation taken for all of the columns n of the evaluation-value-1 calculation data table 27a.

Figure 13:
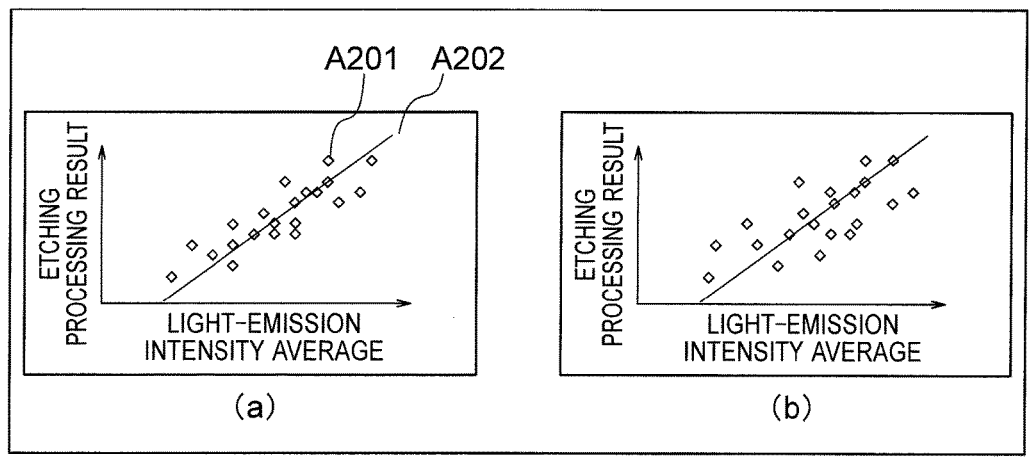
FIG. 13 is an explanatory diagram for explaining the calculation processing for calculating the evaluation value 1 according to an embodiment of the present invention.

Next, referring to FIG. 13, the explanation will be given below concerning the meanings of the values calculated. FIG. 13 is a scatter diagram for illustrating the value stored into the light-emission intensity average value field 27b and the value stored into the etching-processing-result field 27c. Each point denoted by A201 in the (a) of the FIG. 13 indicates each value that is stored into each column of the evaluation-value-1 calculation data table 27a. Namely, each point denoted by A201 is a point represented in a coordinate system where the value stored into the light-emission intensity average value field 27b is taken along its transverse axis, and where the value stored into the etching-processing-result field 27c is taken along its longitudinal axis. The straight line denoted by A202 is a straight line that is drawn so that the average of the square sum-total of the distances from the respective points to this straight line becomes equal to its minimum value.

The slope ($a_{11}$) calculated in the Expression (4) indicates the slope of the straight line denoted by A202. Also, the prediction error ($e_{11}$) calculated in the Expression (5) indicates the average of the square sum-total of the distances between the respective points and the straight line.

The (a) and (b) of the FIG. 13 are the scatter diagrams for indicating the average values of the light-emission intensities at mutually different wavelengths and times. Accordingly, the values of the etching processing result at each point are equal to each other, but the values of the light-emission intensities at each point are different from each other.

The prediction error ($e_{11}$) is calculated with respect to the data illustrated in the (a) of the FIG. 13 and the data illustrated in the (b) of the FIG. 13, respectively. This calculation results in the fact that the prediction error ($e_{11}$) becomes smaller in the data illustrated in the (a) of the FIG. 13. Namely, in the data illustrated in the (a) of the FIG. 13, each point distributes in more proximity to the straight line. This fact shows that the light-emission intensity average value illustrated in the (a) of the FIG. 13 is more suitable for the prediction of the etching processing result in the etching-processing-result prediction-value calculation processing described earlier (S102). By selecting a wavelength and a time at which the prediction error ($e_{11}$) becomes small, it becomes possible to select the wavelength and the time which are suitable for the etching-processing-result prediction-value calculation processing.

The calculated prediction error ($e_{11}$) is stored into the concerned target row of the evaluation-value-1 field 26f as information for evaluating the good-or-bad quality of the wavelength candidate and the time candidate in the concerned target row.

Incidentally, even if some other value is a value other than the prediction error calculated here, this value may be used as long as it is a value that indicates a variation in the prediction result when the etching processing result is predicted using the light-emission intensity. For example, this value may be a correlation coefficient between the light-emission intensity average value and the etching processing result.

(S204)

The calculation unit 21 calculates the value of the evaluation value 2, then storing this calculated value into the concerned target row of the evaluation-value-2 field 26g. Namely, the calculation unit 21 calculates the prediction error ($e_{21}$) that occurs when the light-emission intensity is predicted using the etching processing condition (i.e., gas flow quantity). This calculation is performed using the values stored into the evaluation-value-2 calculation data table 28a, and the following Expressions (6) to (10):

[Expression 6]

$$X_{21} = \sum x_{2i}^2 - \frac{\left(\sum x_{2i}\right)^2}{m} \qquad (6)$$

[Expression 7]

$$X_{22} = \sum y_{2i}^2 - \frac{\left(\sum y_{2i}\right)^2}{m} \qquad (7)$$

[Expression 8]

$$X_{23} = \sum x_{2i}y_{2i} - \frac{\left(\sum x_{2i}\right)\left(\sum y_{2i}\right)}{m} \qquad (8)$$

[Expression 9]

$$a_{21} = \frac{x_{23}}{x_{21}} \qquad (9)$$

[Expression 10]

$$e_{21} = \frac{(x_{22} - a_{21}x_{23})}{m} \qquad (10)$$

In the present Expressions, the notation $x_{2i}$ denotes the value stored into the i-th column of the etching-processing-condition (i.e., gas-flow-quantity) field 28c of the evaluation-value-2 calculation data table 28a. The notation $y_{2i}$ denotes the value stored into the i-th column of the light-emission intensity average value field 28b thereof. The notation m denotes the column number of the evaluation-value-2 calculation data table 28a. The notation denotes the summation taken for all of the columns m of the evaluation-value-2 calculation data table 28a.

Figure 14:
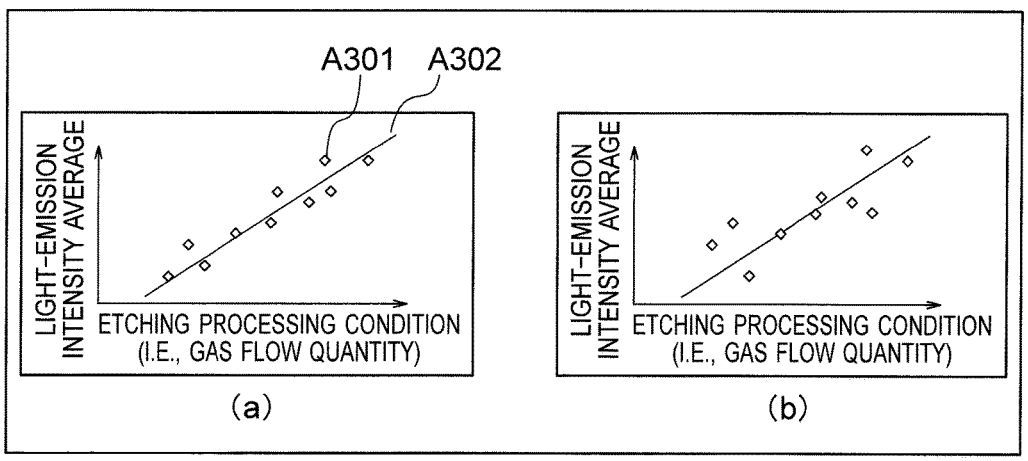
FIG. 14 is an explanatory diagram for explaining the calculation processing for calculating the evaluation value 2 according to an embodiment of the present invention.

Next, referring to FIG. 14, the explanation will be given below concerning the meanings of the values calculated. FIG. 14 is a scatter diagram for illustrating the value stored into the etching-processing-condition (i.e., gas-flow-quantity) field 28c, and the value stored into the light-emission intensity average value field 28b.

Each point denoted by A301 in the (a) of the FIG. 14 indicates each value that is stored into each column of the evaluation-value-2 calculation data table 28a. Namely, each point denoted by A301 is a point represented in a coordinate system where the value stored into the etching-processing-condition field 28c is taken along its transverse axis, and where the value stored into the light-emission intensity average value field 28b is taken along its longitudinal axis.

The straight line denoted by A302 is a straight line that is drawn so that the average of the square sum-total of the distances from the respective points to this straight line becomes equal to its minimum value.

The slope ($a_{21}$) calculated in the Expression (10) indicates the average of the square sum-total of the distances between the respective points and this straight line. The (a) and (b) of the FIG. 14 are the scatter diagrams for indicating the average values of the light-emission intensities at mutually different wavelengths and times. Accordingly, the values of the etching processing condition (i.e., gas flow quantity) at each point are equal to each other, but the values of the light-emission intensities at each point are different from each other.

The prediction error ($e_{21}$) is calculated with respect to the data illustrated in the (a) of the FIG. 14 and the data illustrated in the (b) of the FIG. 14, respectively. This calculation results in the fact that the prediction error ($e_{21}$) becomes smaller in the data illustrated in the (a) of the FIG. 14. In the data illustrated in the (b) of the FIG. 14, however, a variation in the light-emission intensity average value becomes larger if the etching processing condition (i.e., gas flow quantity) becomes larger or smaller. At the time of adjusting the etching processing condition (i.e., gas flow quantity), the use of the light-emission intensity average value like this results in an increase in the prediction error of the etching processing result in the etching-processing-result prediction-value calculation processing described earlier (S102). Accordingly, by selecting a wavelength and a time at which the prediction error ($e_{21}$) becomes small, i.e., the wavelength and the time at which the variation in the light-emission intensity average value becomes small at the time of changing the etching processing condition (i.e., gas flow quantity), it becomes possible to select the wavelength and the time which are suitable for the etching-processing-result prediction-value calculation processing.

The contribution degree of the calculated prediction error ($e_{21}$) to the prediction error of the etching processing result is calculated as the product of the prediction error ($e_{21}$) and the slope ($a_{11}$) described earlier. The product of the prediction error ($e_{21}$) and the slope ($a_{11}$) described earlier is stored into the concerned target row of the evaluation-value-2 field 26g as the information for evaluating the good-or-bad quality of the wavelength candidate and the time candidate in the concerned target row.

Incidentally, even if some other value is a value other than the prediction error calculated here, this value may be used as long as it is a value that indicates the magnitude of a variation in the light-emission intensity average value at the wavelength and the time when the etching processing condition is changed. For example, this value may be a correlation coefficient between the etching processing condition (i.e., gas flow quantity) and the light-emission intensity average value.

(S205)
The calculation unit 21 stores, into the concerned target row of the sum-total value field 26h, the sum total of the value stored into the concerned target row of the evaluation-value-1 field 26f and the value stored into the concerned target row of the evaluation-value-2 field 26g.

(S206)
The calculation unit 21 executes the processings from S202 to S206 until the sum totals are stored into the sum-total value field 26h with respect to all of the rows of the condition-result data table 26a.

(S207)
The calculation unit 21 identifies a row in which the value stored into the sum-total value field 26h is the smallest value. Hereinafter, this row identified will be referred to as "the concerned target row". Moreover, the calculation unit 21 stores "○" into the concerned target row of the sum-total value minimum field 26i, then presenting, to the designer, the values stored into the concerned target row, and the scatter diagram.

Figure 15:
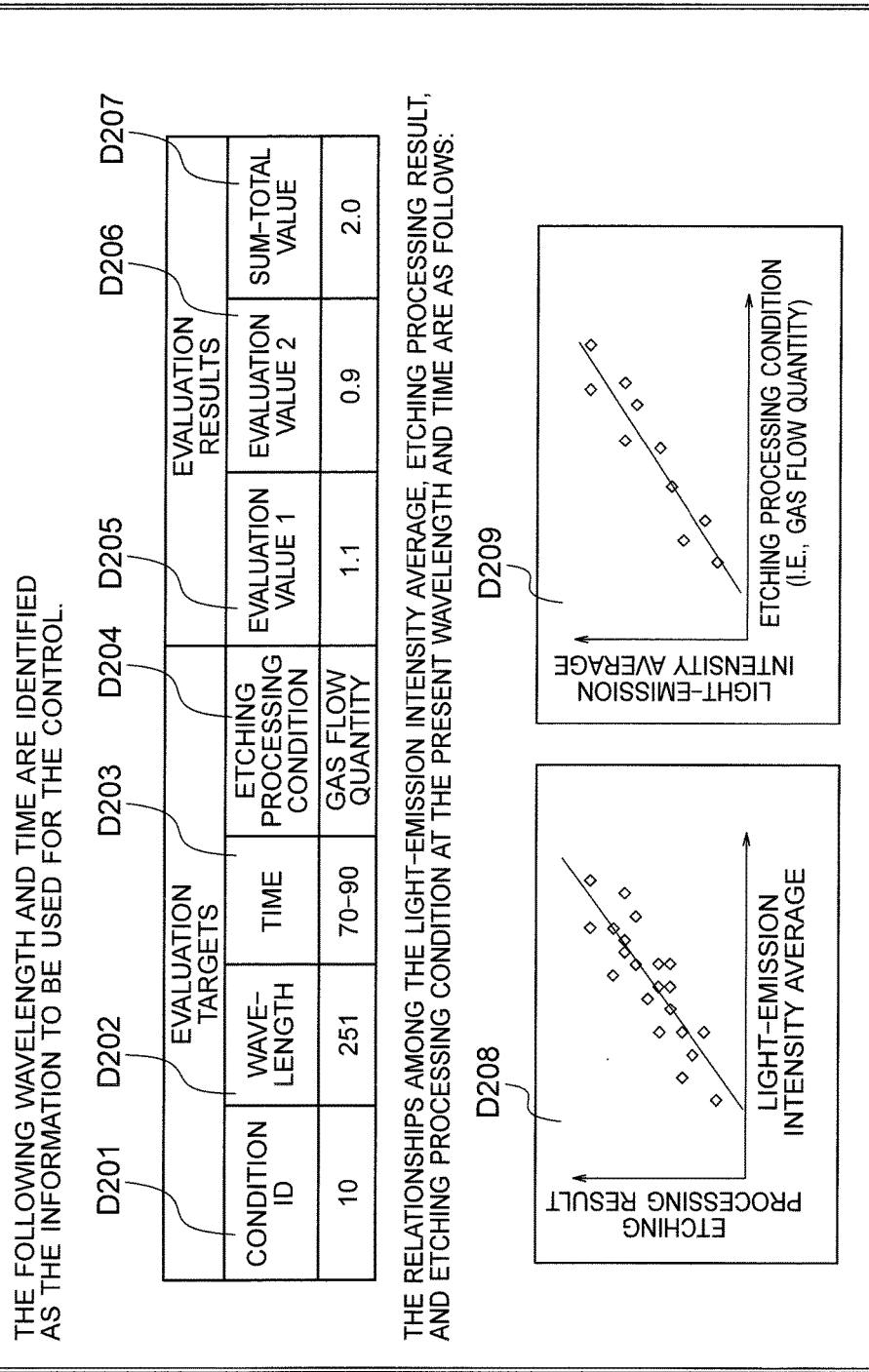
FIG. 15 is a diagram for illustrating the display screen according to an embodiment of the present invention.

FIG. 15 illustrates an output screen that the calculation unit 21 presents to the designer. The values stored into the concerned target row of the condition ID field 26b, the wavelength field 26c, the time field 26d, the etching-processing-condition field 26e, the evaluation-value-1 field 26f, the evaluation-value-2 field 26g, and the sum-total value field 26h of the condition-result data table 26a are respectively displayed onto a condition ID field D201, a wavelength field D202, a time field D203, an etching-processing-condition field D204, an evaluation-value-1 field D205, an evaluation-value-2 field D206, and a sum-total value field D207 illustrated in FIG. 15.

Also, a notation D208 denotes the scatter diagram illustrated in FIG. 13, where the light-emission intensity average value and the etching processing result are assumed. Here, this scatter diagram is created using the values of the wavelength and time stored into the concerned target row of the wavelength field 26c and time field 26d, and the values stored into the mass-production data table 23a and the OES data table 25a. A notation D209 denotes the scatter diagram illustrated in FIG. 14, where the etching processing condition (i.e., gas flow quantity) and the light-emission intensity average value are assumed. Here, this scatter diagram is created using the values of the wavelength and time stored into the concerned target row of the wavelength field 26c and time field 26d, and the values stored into the experiment data table 24a and the OES data table 25a.

The designer watches the output screen illustrated in FIG. 15. As a result of this watching, even if the etching processing condition is adjusted, the designer can grasp a wavelength and a time at which the prediction error of the etching processing result is small. Consequently, the designer can easily grasp which wavelength and time are suitable for the adjustment control.

Incidentally, if different etching processing conditions are inputted into each row of the etching-processing-condition field D204, the evaluation-value sum total is calculated with respect to each of these etching processing conditions. Then, the combination of a wavelength and a time at which the evaluation-value sum total is small is outputted with respect to each of these etching processing conditions. Also, the evaluation-value sum total is calculated with respect to each of these etching processing conditions. Then, the combination of a wavelength, a time, and an etching processing condition at which the evaluation-value sum total is the smallest may be outputted.

As having been explained so far, the employment of the analysis method executed by the etching apparatus 1 (analysis unit 20) of the present embodiment allows implementation of the following analysis method: Namely, the analysis method of acquiring the plasma light-emission data (i.e., experiment data) indicating light-emission intensities at a plurality of different wavelengths and times, the plasma light-emission data being measured under a plurality of different etching processing conditions such as gas flow quantities, and being obtained at the time of the etching processing, evaluating the relationship between changes in the etching processing conditions and changes in the light-emission intensities at the plurality of different wavelengths and times with respect to the wavelengths and times of the plasma light-emission data, and identifying a wavelength and a time of the plasma light-emission data based on the evaluation result, the wavelength and the time of the plasma light-emission data being to be used for the adjustment of the etching processing condition. Namely, even if the etching processing condition such as the gas flow quantity is adjusted, a wavelength and a time at which the prediction error of the etching processing result is small, i.e., the wavelength and the time which are suitable for the control over the adjustment of the etching processing condition, can be easily grasped from among a large number of wavelength candidates and time candidates.

As having been described so far, the concrete explanation has been given concerning the embodiments of the present invention. The present invention, however, is not limited to the embodiments described so far. Namely, the present invention can be modified in a variety of ways within the scope of not departing from its essence and spirit.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma etching apparatus, comprising:
   a plasma micromachining unit configured to apply an etching processing to a semiconductor wafer using plasma;
   an optical emission spectroscopy unit configured to detect light-emission of said plasma, including a wavelength of plasma-light emission when the plasma light-emission was obtained; and
   an analysis unit including a calculation unit, wherein said calculation unit is configured to:
      identify a wavelength candidate and a time candidate and calculate a corresponding average value of light-emission intensities for the determined wavelength candidate, over a time or a section of times defined by the time candidate;
      calculate a first value indicating a difference between predicted results when an etching processing result is predicted by a light-emission intensity, by using a relationship between the etching processing result and light-emission intensities at said wavelength of plasma light-emission and said time or said section of times when the plasma light-emission data was obtained;
      calculate a second value indicating a difference between said light-emission intensities when said etching processing conditions are changed, by using a relationship between changes in said etching processing conditions and changes in said light-emission intensities at said wavelength of plasma light-emission and said time or said section of times when the plasma light-emission data was obtained, and
      identify a wavelength of plasma light-emission and said time or said section of times when said plasma light-emission was obtained, based on the first value and the second value, said wavelength and said time or said section of times being suitable for the adjustment of said etching processing condition; and
   a control unit configured to control a plasma etching unit, the control unit configured to apply an adjustment value of the etching processing conditions so that the etching processing result becomes equal to a target value of the etching processing result, the adjustment value based on the relationship between the light-emission intensity of the plasma light-emission data at the identified wavelength at the identified time or at the identified section of times and the etching processing result at the identified time or at the identified section of times.

2. The plasma etching apparatus according to claim 1, wherein
   said first value is a prediction error or a correlation coefficient.

3. The plasma etching apparatus according to claim 2, wherein,
   said second value is a prediction error or a correlation coefficient,
   said calculation unit is configured to identify said wavelength of plasma light-emission and said time or said section of times when said plasma light-emission was obtained, said wavelength and said time or said section of times being suitable for the adjustment of an etching processing condition, so that a function becomes equal to its minimum value, said prediction error or said correlation coefficient of said first value and said prediction error or said correlation coefficient of said second value being used in said function.

4. The plasma etching apparatus according to claim 2, wherein
   said second value is a prediction error or a correlation coefficient,
   said calculation unit is configured to identify said wavelength of plasma light-emission and said time or said section of times when said plasma light-emission was obtained, said wavelength and said time or said section of times being suitable for the adjustment of an etching processing condition, so that the sum total of said prediction error of said first value and a product becomes equal to its minimum value, said product being obtained by multiplying said prediction error of said second value by a coefficient, said coefficient indicating said relationship between changes in said etching processing conditions, and changes in said light-emission intensities at said wavelength of plasma light-emission and said time or said section of times when the plasma light-emission data was obtained.

5. The plasma etching apparatus according to claim 1, wherein
   said second value is a prediction error or a correlation coefficient.

6. The plasma etching apparatus according to claim 1, wherein
   said plasma etching unit performs a plasma etching under said etching processing condition adjusted based on said adjustment value calculated at said calculation unit.

7. A plasma etching apparatus, comprising:
   a plasma micromachining unit configured to apply an etching processing to a semiconductor wafer using plasma;
   an optical emission spectroscopy unit configured to detect light-emission of said plasma, including a wavelength of plasma-light emission when the plasma light-emission was obtained; and
   an analysis unit including a calculation processor constructed at least in part of hardware, wherein said calculation processor is configured to:
      calculate a first value indicating a difference between predicted results when an etching processing result is predicted by a light-emission intensity, by using a relationship between the etching processing result and light-emission intensities at said wavelength of plasma light-emission and said time or said section of times when the plasma light-emission data was obtained;

calculate a second value indicating a difference between said light-emission intensities when said etching processing conditions are changed, by using a relationship between changes in said etching processing conditions and changes in said light-emission intensities at said wavelength of plasma light-emission and said time or said section of times when the plasma light-emission data was obtained, and identify a wavelength of plasma light-emission and said time or said section of times when said plasma light-emission was obtained, based on the first value and the second value, said wavelength and said time or said section of times being suitable for the adjustment of said etching processing condition; and a control unit configured to control a plasma etching unit, the control unit configured to apply an adjustment value of the etching processing conditions so that the etching processing result becomes equal to a target value of the etching processing result, the adjustment value based on the relationship between the light-emission intensity of the plasma light-emission data at the identified wavelength at the identified time or at the identified section of times and the etching processing result at the identified time or at the identified section of times.

8. A plasma etching apparatus, comprising:

a plasma micromachining unit configured to apply an etching processing to a semiconductor wafer using plasma;

an optical emission spectroscopy unit configured to detect light-emission of said plasma, including a wavelength of plasma-light emission when the plasma light-emission was obtained; and an analysis unit including a calculation processor constructed at least in part of hardware, wherein said calculation processor is configured to:

identify a wavelength candidate and a time candidate and calculate a corresponding average value of light-emission intensities for the determined wavelength candidate, over a time or a section of times defined by the time candidate;

calculate a first value indicating a difference between predicted results when an etching processing result is predicted by a light-emission intensity, by using a relationship between the etching processing result and light-emission intensities at said wavelength of plasma light-emission and said time or said section of times when the plasma light-emission data was obtained;

calculate a second value indicating a difference between said light-emission intensities when said etching processing conditions are changed, by using a relationship between changes in said etching processing conditions and changes in said light-emission intensities at said wavelength of plasma light-emission and said time or said section of times when the plasma light-emission data was obtained, and identify a wavelength of plasma light-emission and said time or said section of times when said plasma light-emission was obtained, based on the first value and the second value, said wavelength and said time or said section of times being suitable for the adjustment of said etching processing condition; and a control unit configured to control a plasma etching unit, the control unit configured to apply an adjustment value of the etching processing conditions so that the etching processing result becomes equal to a target value of the etching processing result, the adjustment value based on the relationship between the light-emission intensity of the plasma light-emission data at the identified wavelength at the identified time or at the identified section of times and the etching processing result at the identified time or at the identified section of times.

* * * * *